United States Patent
Chiba

(10) Patent No.: US 7,716,416 B2
(45) Date of Patent: May 11, 2010

(54) ANALYSIS FOR A MULTIPLE TAG HIT IN A CONTENT ADDRESSABLE MEMORY (CAM)

(75) Inventor: Takuma Chiba, Koto (JP)

(73) Assignee: Fujitsu Limited, Kawasaki (JP)

( * ) Notice: Subject to any disclaimer, the term of this patent is extended or adjusted under 35 U.S.C. 154(b) by 116 days.

(21) Appl. No.: 11/340,848

(22) Filed: Jan. 27, 2006
(Under 37 CFR 1.47)

(65) Prior Publication Data
US 2007/0186035 A1      Aug. 9, 2007

Related U.S. Application Data

(63) Continuation of application No. PCT/JP03/09596, filed on Jul. 29, 2003.

(51) Int. Cl.
*G06F 12/00* (2006.01)
*G06F 13/00* (2006.01)
*G06F 13/28* (2006.01)

(52) U.S. Cl. .................... 711/108; 714/805
(58) Field of Classification Search .............. None
See application file for complete search history.

(56) References Cited

U.S. PATENT DOCUMENTS

| | | | |
|---|---|---|---|
| 5,434,871 A * | 7/1995 | Purdham et al. | 714/805 |
| 5,509,119 A | 4/1996 | La Fetra | |
| 6,067,656 A * | 5/2000 | Rusu et al. | 714/768 |
| 6,470,437 B1 * | 10/2002 | Lyon | 711/207 |
| 6,480,975 B1 * | 11/2002 | Arimilli et al. | 714/52 |
| 6,606,681 B1 * | 8/2003 | Uzun | 711/108 |
| 2004/0196700 A1 * | 10/2004 | Chai et al. | 365/189.07 |

FOREIGN PATENT DOCUMENTS

| | | |
|---|---|---|
| JP | 57-092499 | 6/1982 |
| JP | 62-212751 | 9/1987 |
| JP | 07-248970 | 9/1995 |
| JP | 8-95856 | 4/1996 |
| JP | 2000-132460 | 5/2000 |

OTHER PUBLICATIONS

Handy, The Cache Memory Book, 1998, Academic Press, 2nd Edition, p. 14.*

* cited by examiner

*Primary Examiner*—Christian P Chace
*Assistant Examiner*—Chad L Davidson
(74) *Attorney, Agent, or Firm*—Staas & Halsey LLP

(57) ABSTRACT

A tag storing unit stores, in a plurality of entries, a plurality of tags corresponding to a plurality of addresses, a parity bit of each of the tags, and a reverse bit obtained by reversing the parity bit. A data storing unit stores a plurality of data corresponding to the tags in a plurality of entries. A comparing unit compares an address for search with a tag of each of the entries. A determining unit performs an OR-operation on contents stored in a plurality of entries when a multiple hit occurs from a comparison by the comparing unit, and determines a cause of the multiple hit based on a parity bit and a reverse bit obtained after the OR-operation.

7 Claims, 21 Drawing Sheets

FIG.10

| MASK CONTROL BIT | MASK BIT |
|---|---|
| G = 1 | TAG<12:0> |
| SIZE = 11 | TAG<21:13> |
| SIZE = 10 | TAG<18:13> |
| SIZE = 01 | TAG<15:13> |

| ADDRESS<63 : 0> | DATA<63 : 0> |
|---|---|
| 00···00000 | DATA |
| 00···00001 | DATA |
| 00···00010 | DATA |
| 00···00011 | DATA |
| 00···00100 | DATA |
| ⋮ | ⋮ |
| 00···01000 | DATA |
| 00···01001 | DATA |
| 00···01010 | DATA |
| ⋮ | ⋮ |

ANALYSIS FOR A MULTIPLE TAG HIT IN A CONTENT ADDRESSABLE MEMORY (CAM)

This application is a continuing application, filed under 35 U.S.C. §111(a), of International Application PCT/JP03/09596, filed Jul. 29, 2003.

BACKGROUND OF THE INVENTION

1. Field of the Invention

The present invention relates to a technology for specifying a cause of occurrence of multiple hits with a small-scale and simple configuration in a content addressable memory (CAM).

2. Description of the Related Art

FIG. 17 is a block diagram of an application example of a conventional cache memory device 11. The cache memory device 11 is a storage device, for example, a CAM device used to compensate for a speed difference between a central processing unit (CPU) 10 and a main memory 13. The CAM mentioned here is a memory in which a location of data stored in a memory area is indicated not by an address but by a content.

The CPU 10 accesses the cache memory device 11 or the main memory 13 to perform data read/write.

The main memory 13 has such characteristics that it has a large capacity and access time is slow as compared with that of the cache memory device 11. As shown in FIG. 18, the main memory 13 stores all the data used in the CPU 10.

More specifically, the main memory 13 stores 64-bit data<63:0> coupled to respective 64-bit addresses<63:0> (0 bit to 63 bits).

Referring back to FIG. 17, the cache memory device 11 has characteristics such that the access time is short as compared with that of the main memory 13.

Furthermore, the storage capacity of the main memory 13 is larger than that of the cache memory device 11.

FIG. 19 is a diagram of the cache memory device 11 of FIG. 17. A tag random access memory (RAM) 12a stores up to 32 addresses <63:0> (see FIG. 18) at maximum, each as TAG<63:0> (tag) stored in the main memory 13.

A data RAM 12b also stores up to 32 data at maximum, each as DATA<63:0>, coupled to the respective tags TAG<63:0> stored in the tag RAM 12a.

More specifically, the tag RAM 12a has Entries 0 to 31 as memory locations. The address<63:0> (see FIG. 18) stored in the main memory 13 as TAG<63:0> (tag) is stored in each of the Entries 0 to 31.

Similarly to the tag RAM 12a, the data RAM 12b also has Entries 0 to 31 as memory locations. The Entries 0 to 31 of the tag RAM 12a are coupled to the respective Entries 0 to 31 of the data RAM 12b.

Respectively stored in the Entries 0 to 31 of the data RAM 12b are data<63:0> (see FIG. 18) that are stored in the main memory 13, each as DATA<63:0>.

Comparators $20_0$ to $20_{31}$ are provided corresponding to the respective Entries 0 to 31 of the tag RAM 12a, and each of them compares a 64-bit search address "ACCS_ADRS <63:0>" output from the CPU 10 (see FIG. 17) with a tag "TAG<63:0>" stored in each of the Entries 0 to 31. If the search address and the tag coincide with each other, a relevant comparator outputs the result of comparison indicating tag hit as "TAG_HIT".

During normal operation, any one of the comparators $20_0$ to $20_{31}$ outputs one TAG_HIT (tag hit).

However, when the same TAG<63:0> (tag) is stored in a plurality of entries of the tag RAM 12a, the TAG_HIT (tag hit) is output from the comparators, and it is thereby determined as a multi-hit error. When the multi-hit error occurs, the comparators $20_0$ to $20_{31}$ output the result of determination indicating multiple hits as "MULTI-HIT".

A selector 30 selects DATA<63:0> (data) stored in an entry corresponding to the TAG_HIT (tag hit), out of DATA<63:0> (data) stored in the respective Entries 0 to 31 of the data RAM 12b, and outputs the data selected.

The data "DATA<63:0>" output from the selector 30 is the search result corresponding to the search address "ACCS_ADRS <63:0>", and is input to the CPU 10.

Referring to FIG. 19, it is necessary to check an error due to bit reversed or the like on the tags TAG<63:0> stored in the Entries 0 to 31 of the tag RAM 12a.

FIG. 20 is a diagram of a cache memory device 40 having a parity check function as a function for the check. In FIG. 20, the same reference numerals are assigned to those corresponding to the portions of FIG. 19.

A selector 41 and a parity check unit 42 are newly provided in the configuration of FIG. 20. The selector 41 selects a tag TAG<63:0> stored in an entry corresponding to the TAG_HIT (tag hit), out of the tags TAG<63:0> stored in the respective Entries 0 to 31 of the tag RAM 12a, and outputs the tag.

The parity check mentioned here indicates checking using a parity bit whether there is any error (bit is reversed or so) in data. To perform a parity check, a parity bit (0 or 1) is previously added to original data to be checked so that the number of "1" becomes an even number.

Furthermore, the parity check is performed in the following manner. That is, if the number of "1" is the even number, then it is determined that no error occurs, but if the number of "1" is an odd number, then it is determined that a parity error occurs due to a bit reversed or so.

For example, when the original data has an 8-bit structure such as "00101000", the number of "1" is the even number, and hence, a parity bit of "0" is added to the structure to be a 9-bit structure such as "00101000"+"0".

If "00101000"+"0" is changed to "10101000"+"0" due to the bit reversed or so, the number of "1" is an odd number (=3), and hence, it is determined that the parity error occurs.

When the original data has an 8-bit structure such as "00101100", the number of "1" is an odd number, and hence, a parity bit of "1" is added to be a 9-bit structure such as "00101100"+"1".

If "00101100"+"1" is changed to "10101100"+"1" due to a bit reversed or so, the number of "1" is an odd number (=5), and hence, it is determined that the parity error occurs.

In the cache memory device 40 of FIG. 20, each of the Entries 0 to 31 of the tag RAM 12a stores the tag TAG<63:0> and a parity bit "TAG_P<7:0>".

The parity check unit 42 executes a parity check to TAG<63:0> (tag) selected by the selector 41. If a parity check error occurs, the parity check unit 42 outputs the result of check indicating a party check error as "TAG_PE". When the TAG_PE (party check error) is output, the DATA<63:0> (data) selected by the selector 30 is made invalid.

However, in the cache memory device 40 shown in FIG. 20, when multiple hits MULTI-HIT occur, a cause (and the following first cause and second cause) of the multiple hits cannot be uniquely identified.

More specifically, the first cause of the multiple hits includes a case where the same tag TAG<63:0> is simply stored in the entries of the tag RAM 12a to cause MULTI-HIT (multiple hits).

The second cause includes a case where different tags TAG<63:0> are stored in the entries of the tag RAM 12a, but the two tags TAG<63:0> are determined as the same tag TAG<63:0> due to the error such as a bit reversed, to cause MULTI-HIT (multiple hits).

To resolve the problems in the conventional technology, as shown in a cache memory device 50 of FIG. 21, parity check (PC) units $51_0$ to $51_{31}$ are provided corresponding to the respective Entries 0 to 31 of the tag RAM 12a, and the parity check is executed for each entry.

However, in the cache memory device 50, the parity check units $51_0$ to $51_{31}$, which perform parity checks on 64 bits for 32 entries, respectively, cause an increased circuit scale and a complicated configuration.

Patent Document 1: Japanese Patent Application Laid-Open No. H8-95856.

SUMMARY OF THE INVENTION

It is an object of the present invention to at least solve the problems in the conventional technology.

A content-addressable-memory device according to one aspect of the present invention includes a tag storing unit that stores, in a plurality of entries, a plurality of tags corresponding to a plurality of addresses, a parity bit of each of the tags, and a reverse bit obtained by reversing the parity bit; a data storing unit that stores a plurality of data corresponding to the tags in a plurality of corresponding entries; a comparing unit that compares an address for search with a tag of each of the entries; and a determining unit that performs an OR-operation on contents stored in a plurality of relevant entries when a multiple hit occurs from a comparison by the comparing unit, and determines a cause of the multiple hit based on a parity bit and a reverse bit obtained after the OR-operation.

A method of controlling a content-addressable-memory, according to another aspect of the present invention, includes storing, in a plurality of entries, a plurality of tags corresponding to a plurality of addresses, a parity bit of each of the tags, and a reverse bit obtained by reversing the parity bit; storing a plurality of data corresponding to the tags in a plurality of corresponding entries; comparing an address for search with a tag of each of the entries; performing an OR-operation on contents stored in a plurality of relevant entries when a multiple hit occurs from a comparison at the comparing; and determining a cause of the multiple hit based on a parity bit and a reverse bit obtained after the OR-operation.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 10 is a diagram of a correlation between a mask control bit and a mask bit;

FIG. 18 is a diagram of the main memory of FIG. 17;

DETAILED DESCRIPTION OF THE PREFERRED EMBODIMENTS

Exemplary embodiments of the present invention are explained in detail below with reference to the accompanying drawings.

Figure 1:
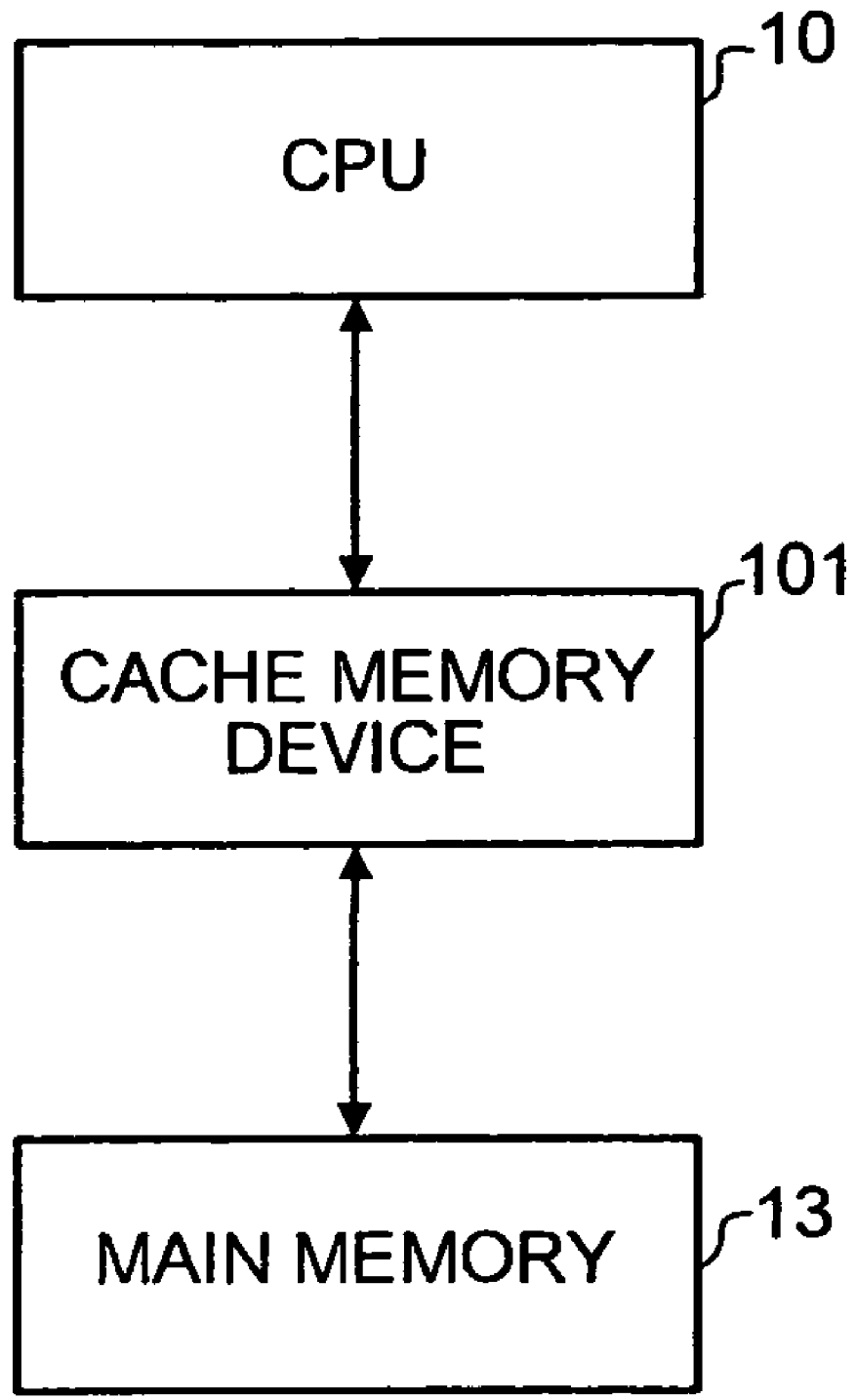
FIG. 1 is a block diagram of an application example of a cache memory device according to a first embodiment of the present invention.
Figure 17:
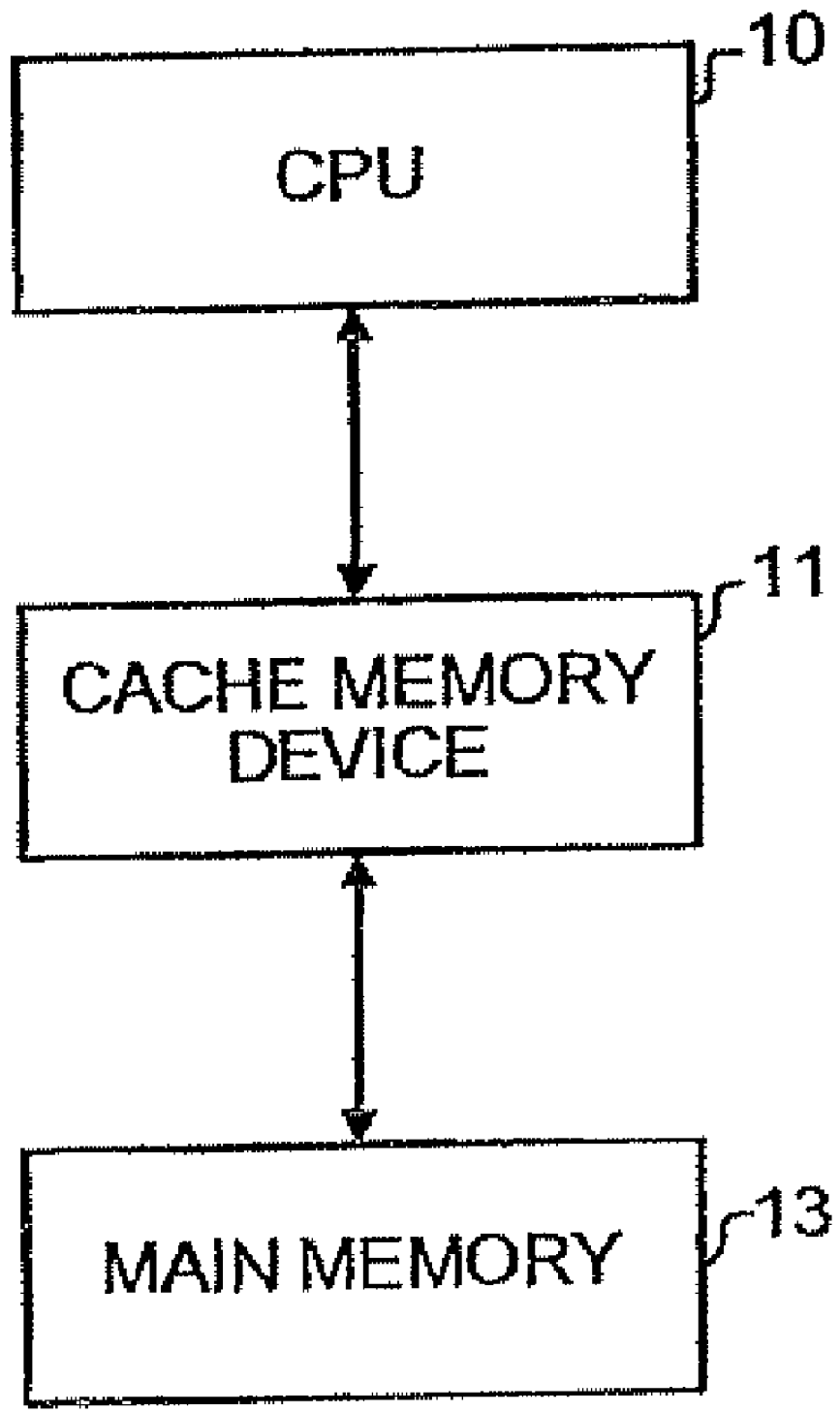
FIG. 17 is a block diagram of an application example of the conventional cache memory device.
Figure 19:
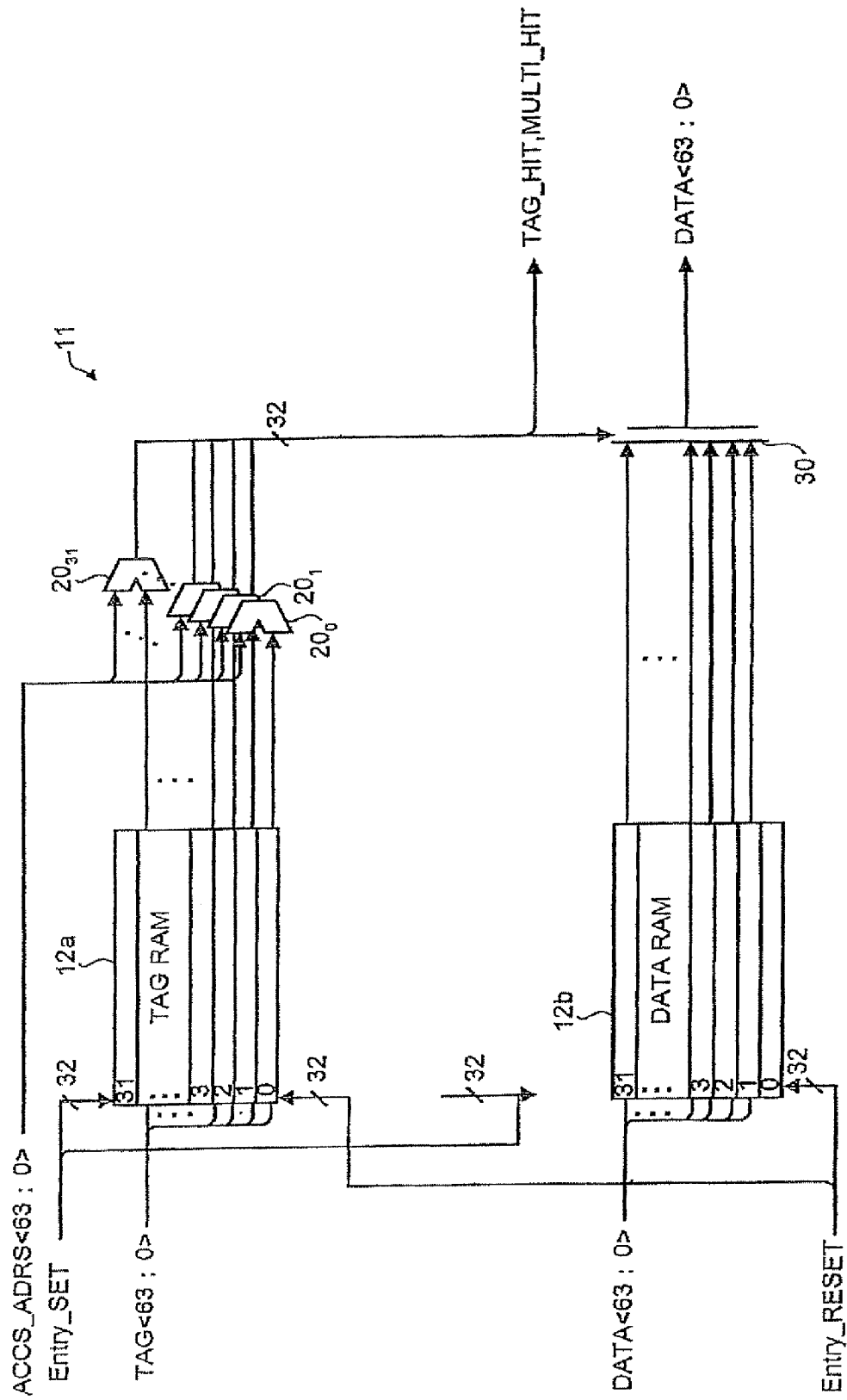
FIG. 19 is a block diagram of the conventional cache memory device.
Figure 20:
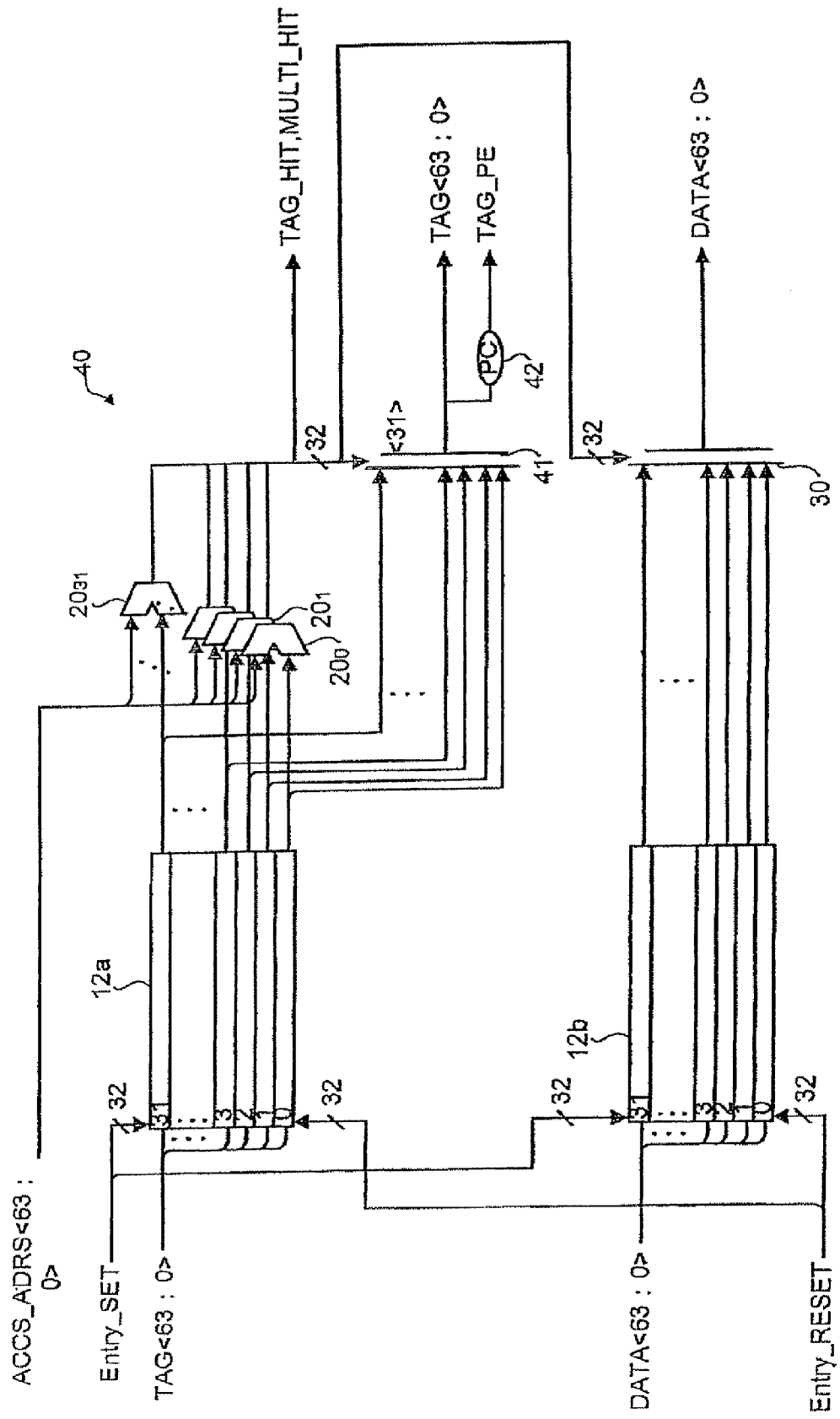
FIG. 20 is a block diagram of another conventional cache memory device.

FIG. 1 is a block diagram of an application example of a cache memory device according to a first embodiment of the present invention. In FIG. 1, the same reference numerals are assigned to those corresponding to the portions of FIG. 17, and explanation thereof is omitted. In FIG. 1, a cache memory device 101 is provided instead of the cache memory device 11 of FIG. 17.

The cache memory device 101 is, for example, a CAM device, which has a function of uniquely identifying a cause of the multiple hits, in addition to a cache access function.

Figure 2:
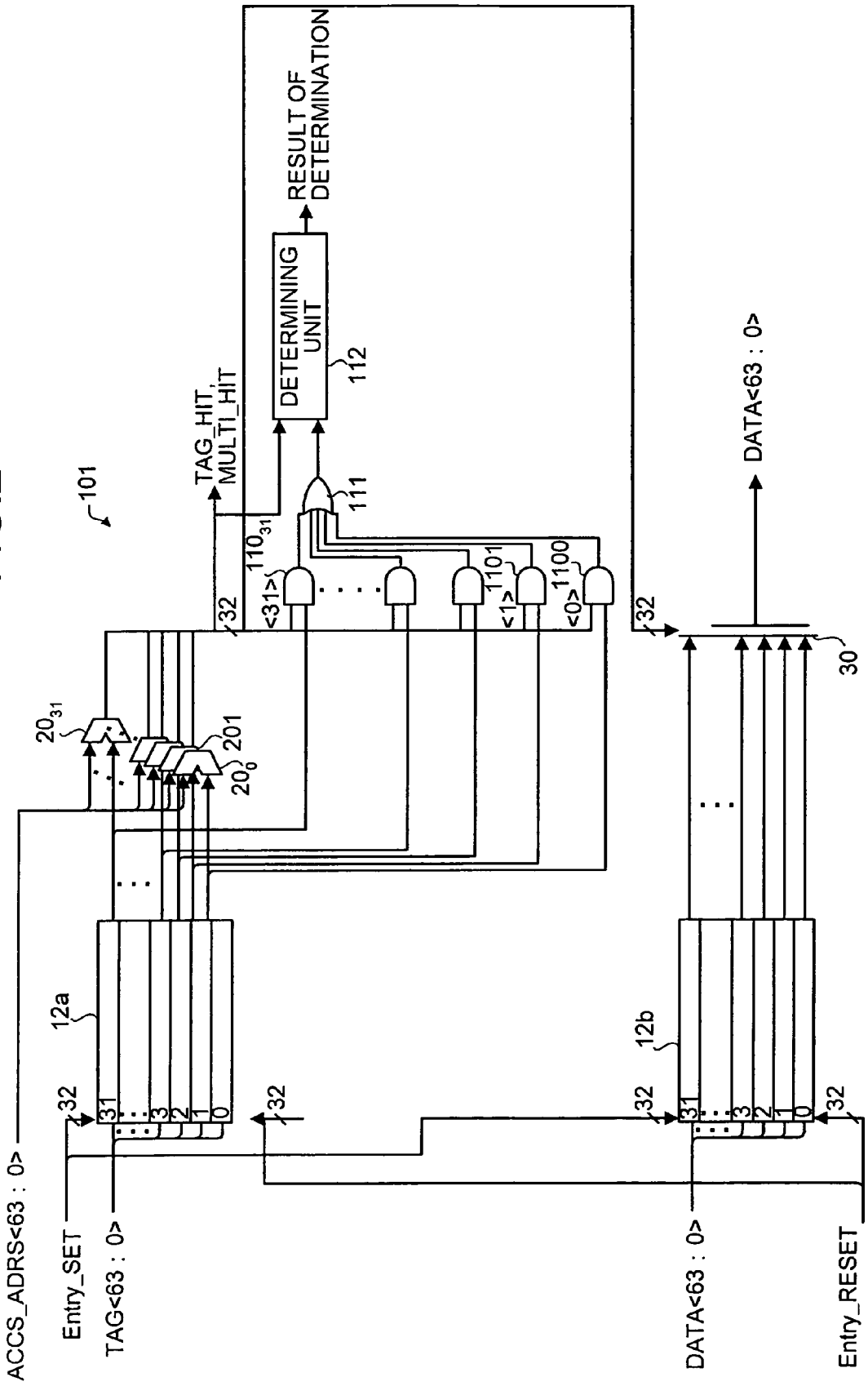
FIG. 2 is a diagram of the cache memory device of FIG. 1.

FIG. 2 is a diagram of the cache memory device 101 of FIG. 1. In FIG. 2, the same reference numerals are assigned to those corresponding to the portions of FIG. 21, and explanation thereof is omitted.

Figure 21:
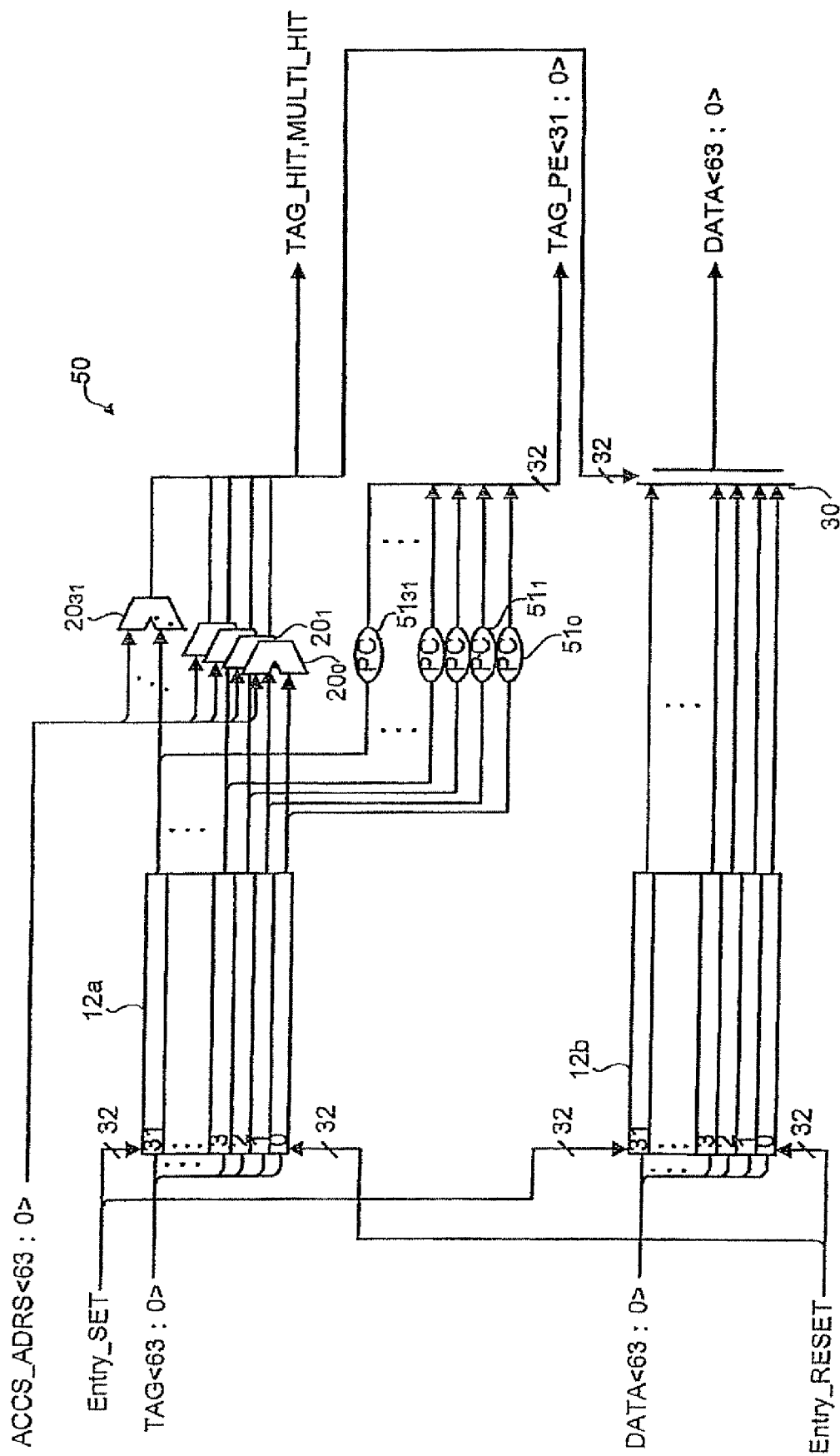
FIG. 21 is a block diagram of a still another conventional cache memory device.

In FIG. 2, AND circuits $110_0$ to $110_{31}$, an OR circuit 111, and a determining unit 112 are provided, instead of the parity check units $51_0$ to $51_{31}$ of FIG. 21.

Figure 3:
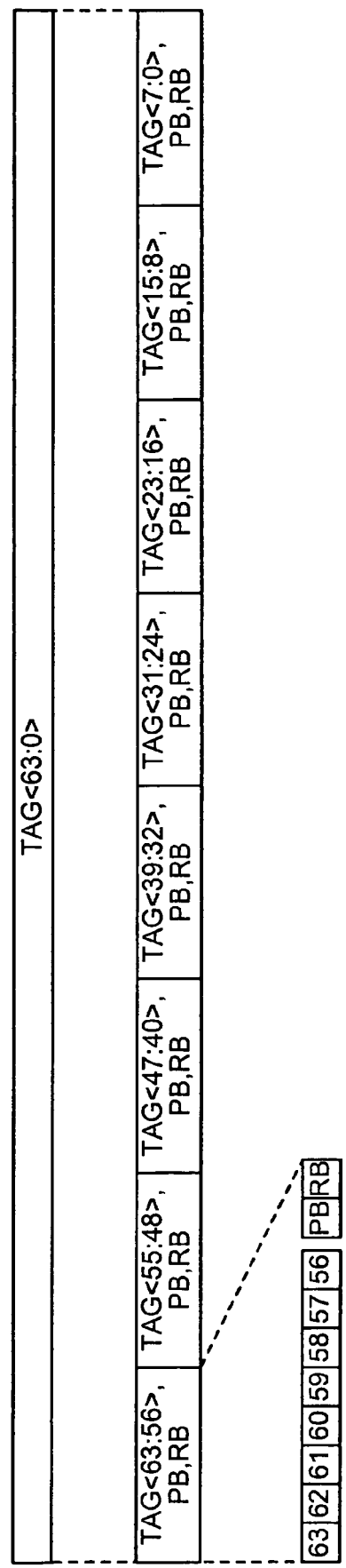
FIG. 3 is a diagram of a format of a tag "TAG<63:0>" according to the first embodiment.

In the first embodiment, a tag "TAG<63:0>" having the format shown in FIG. 3 is stored in the Entries 0 to 31 of the tag RAM 12a (see FIG. 2).

The TAG<63:0> (tag) shown in FIG. 3 is divided into 8 bits each such as TAG<63:56>, TAG<55:48>, TAG<47:40>, TAG<39:32>, TAG<31:24>, TAG<23:16>, TAG<15:8>, and TAG<7:0>, and a parity bit PB and a reverse bit RB are added to each 8 bits.

Referring to, for example, TAG<63:56>, the parity bit PB used for the parity check and the reverse bit RB that is obtained by reversing the parity bit PB are added to the 8 bits ranging from a 56th bit to a 63rd bit. The other TAGs are the same as above.

Figure 4:
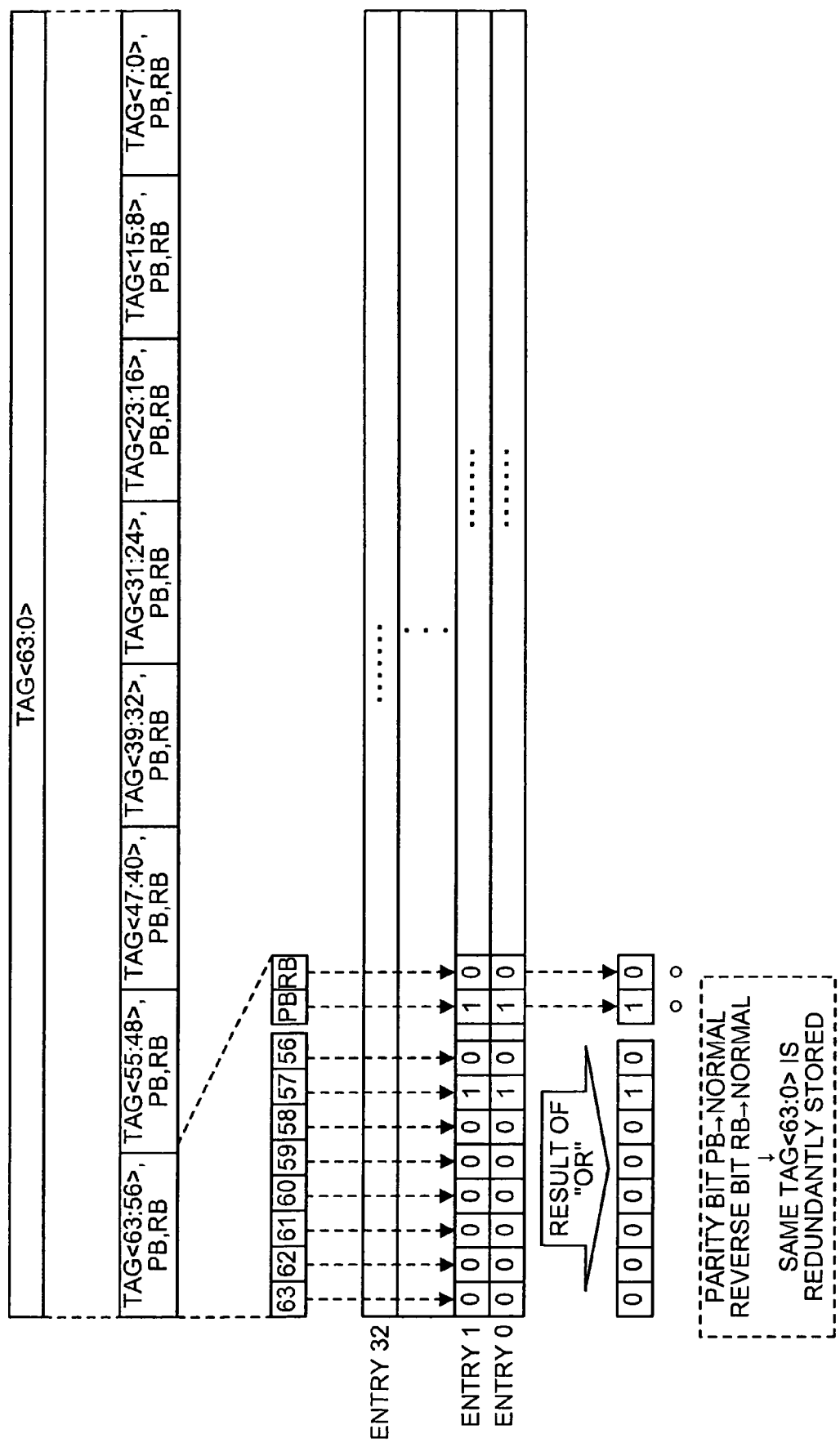
FIG. 4 is a diagram for explaining an operation example 1 according to the first embodiment.

For example, the Entry 0 of the tag RAM 12a in FIG. 4 stores "00000010" as TAG<63:56>, "1" as the parity bit PB corresponding to TAG<63:56>, and "0" as the reverse bit RB obtained by reversing the parity bit ("1").

The Entry 1 of the tag RAM 12a also stores "00000010" as TAG<63:56>, "1" as the parity bit PB corresponding to TAG<63:56>, and "0" as the reverse bit RB obtained by reversing the parity bit ("1").

Referring back to FIG. 2, the AND circuits $110_0$ to $110_{31}$ are provided corresponding to the respective Entries 0 to 31 of the tag RAM 12a. These circuits perform an AND operation on the TAG_HIT (tag hit) from the comparators $20_0$ to $20_{31}$ and the tags TAG<63:0> (see FIG. 3) stored in the Entries 0 to 31, respectively.

The OR circuit 111 performs an OR operation on outputs of the AND circuits $110_0$ to $110_{31}$. The determining unit 112 determines the cause of occurrence of multiple hits MULTI-HIT, based on the output of the OR circuit 111. The detail of the operation of the determining unit 112 is explained later.

In the configuration, when the search address ACCS_ADRS <63:0> is input to the comparators $20_0$ to $20_{31}$ of FIG. 2 from the CPU 10 (see FIG. 10), each of the comparators $20_0$ to $20_{31}$ compares the search address ACCS_ADRS <63:0> with each tag TAG<63:0> (see FIG. 3) stored in the Entries 0 to 31 of the tag RAM 12a.

In this case, if the tags TAG<63:0> stored in the Entry 0 and the Entry 1 of FIG. 4 match the search address ACCS_ADRS <63:0>, the comparator $20_0$ and the comparator $20_1$ output the TAG_HIT (tag hit) and the MULTI-HIT (multiple hits).

With these outputs, the AND circuit $110_0$ and the AND circuit $110_1$ output the tags TAG<63:0> stored in the Entry 0 and Entry 1 of FIG. 4, respectively, as an operation example 1 of the first embodiment.

Referring here to TAG<63:56>, PB, and RB, "00000010-10" is output from the AND circuit $110_0$ corresponding to the Entry 0, to the OR circuit 111.

On the other hand, "00000010-10" is also output from the AND circuit $110_1$ corresponding to the Entry 1 to the OR circuit 111. The OR circuit 111 performs an OR operation on "00000010-10" (Entry 0) and "00000010-10" (Entry 1), and outputs "00000010-10" to the determining unit 112.

The determining unit 112 performs a parity check on "00000010-10". In this case, the determining unit 112 determines that in "00000010-1*" (* is reverse bit RB), the number of "1" is an even number and the result of the parity check is normal and the reverse bit RB (=0) is also normal (reverse of the parity bit PB (=1)). Therefore, the determining unit 112 determines that the cause of occurrence of the multiple hits may be such that the same tag TAG<63:0> is redundantly stored in the entries.

Figure 5:
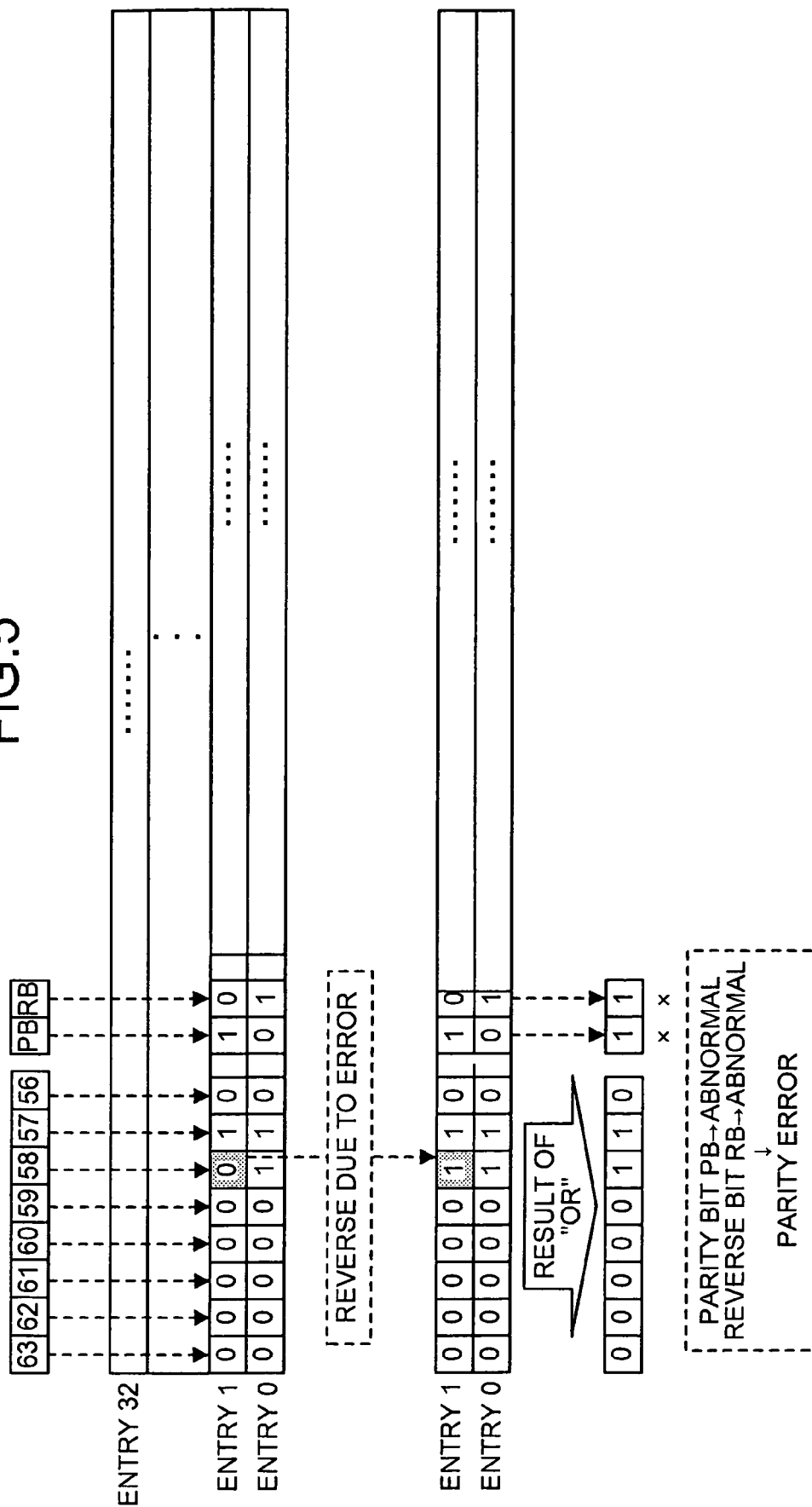
FIG. 5 is a diagram for explaining an operation example 2 according to the first embodiment.

As an operation example 2 of the first embodiment shown in FIG. 5, "00000110-01" is stored in the Entry 0 of the tag RAM 12a and "00000010-10" is stored in the Entry 1 thereof.

Here, in TAG<58> of the Entry 1, "0" is reversed to "1" due to an error.

In this state, when the search address ACCS_ADRS <63:0> is input to the comparators $20_0$ to $20_{31}$ of FIG. 2 from the CPU 10 (see FIG. 1), each of the comparators $20_0$ to $20_{31}$ compares the search address input with each tag TAG<63:0> (see FIG. 3) stored in the Entries 0 to 31 of the tag RAM 12a.

In this case, if the tags TAG<63:0> stored in the Entry 0 and the Entry 1 of FIG. 5 match the search address ACCS_ADRS <63:0>, the comparator $20_0$ and the comparator $20_1$ output the TAG_HIT (tag hit) and the MULTI-HIT (multiple hits).

With these outputs, the AND circuit $110_0$ and the AND circuit $110_1$ output the tags TAG<63:0> stored in the Entry 0 and Entry 1 of FIG. 5, respectively.

Referring here to TAG<63:56>, PB, and RB, "00000110-01" is output from the AND circuit $110_0$ corresponding to the Entry 0, to the OR circuit 111.

On the other hand, "00000110-10" is output from the AND circuit $110_1$ corresponding to the Entry 1, to the OR circuit 111. The OR circuit 111 performs an OR operation on "00000110-01" (Entry 0) and "00000110-10" (Entry 1), and outputs "00000110-11" to the determining unit 112.

The determining unit 112 performs a parity check on "00000110-11". In this case, the determining unit 112 determines that in "00000110-1*" (* is reverse bit RB), the number of "1" is an odd number and the parity bit PB is abnormal and the reverse bit RB (=1) is also abnormal (which is not the reverse of the parity bit PB (=1)). Therefore, the determining unit 112 determines that the cause of occurrence of the multiple hits is the parity error.

Figure 6:
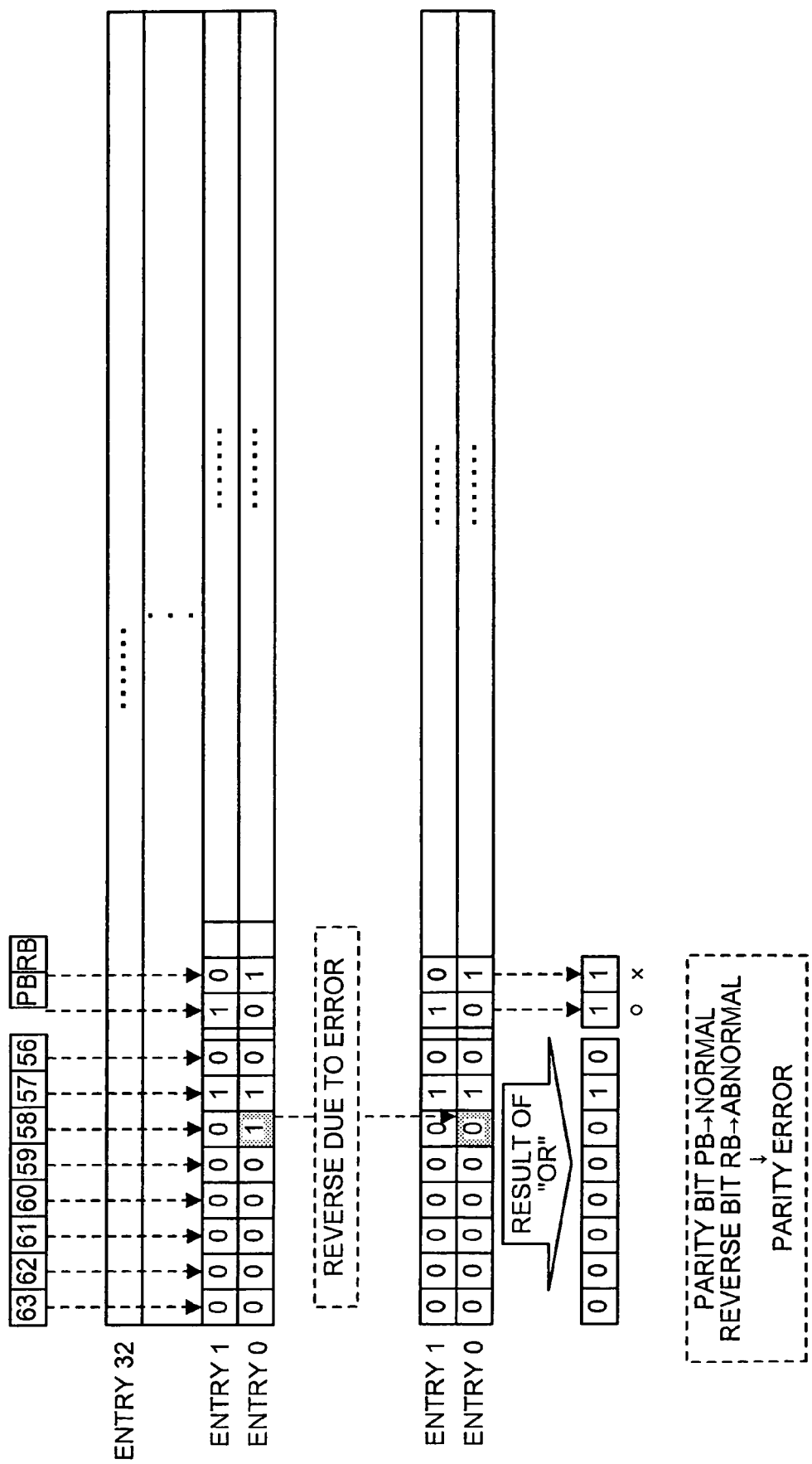
FIG. 6 is a diagram for explaining an operation example 3 according to the first embodiment.

As an operation example 3 of the first embodiment shown in FIG. 6, "00000110-01" is stored in the Entry 0 of the tag RAM 12a and "00000010-10" is stored in the Entry 1 thereof.

Here, in TAG<58> of the Entry 0, "1" is reversed to "0" due to an error.

In this state, when the search address ACCS_ADRS <63:0> is input to the comparators $20_0$ to $20_{31}$ of FIG. 2 from the CPU 10 (see FIG. 1), each of the comparators $20_0$ to $20_{31}$ compares the search address input with each tag TAG<63:0> (see FIG. 3) stored in the respective Entries 0 to 31 of the tag RAM 12a.

In this case, if the tags TAG<63:0> stored in the Entry 0 and the Entry 1 of FIG. 6 match the search address ACCS_ADRS <63:0>, the comparator $20_0$ and the comparator $20_1$ output the TAG_HIT (tag hit) and the MULTI-HIT (multiple hits).

With these outputs, the AND circuit $110_0$ and the AND circuit $110_1$ output the tags TAG<63:0> stored in the Entry 0 and Entry 1 of FIG. 6, respectively.

Referring here to TAG<63:56>, PB, and RB, "00000010-01" is output from the AND circuit $110_0$ corresponding to the Entry 0, to the OR circuit 111.

On the other hand, "00000010-10" is output from the AND circuit $110_1$ corresponding to the Entry 1, to the OR circuit 111. The OR circuit 111 performs an OR operation on "00000010-01" (Entry 0) and "00000010-10" (Entry 1), and outputs "00000010-11" to the determining unit 112.

The determining unit 112 performs a parity check on "00000010-11". In this case, the determining unit 112 determines that in "00000010-1*" (* is reverse bit RB), the number of "1" is an even number and the parity bit PB is normal but the reverse bit RB (=1) is abnormal (which is not the reverse of the parity bit PB (=1)). Therefore, the determining unit 112 determines that the cause of occurrence of the multiple hits is the parity error.

According to the first embodiment as explained above, the cause of occurrence of the multiple hits can be uniquely identified with a small-scale and simple configuration.

In the first embodiment, a function of identifying the cause of occurrence of multiple hits can be added to the configuration in which masking is provided to bits as a part of TAG<63:0> output from the Entries 0 to 31 of the tag RAM 12a. An example of the configuration is explained below as a second embodiment of the present invention.

Figure 7:
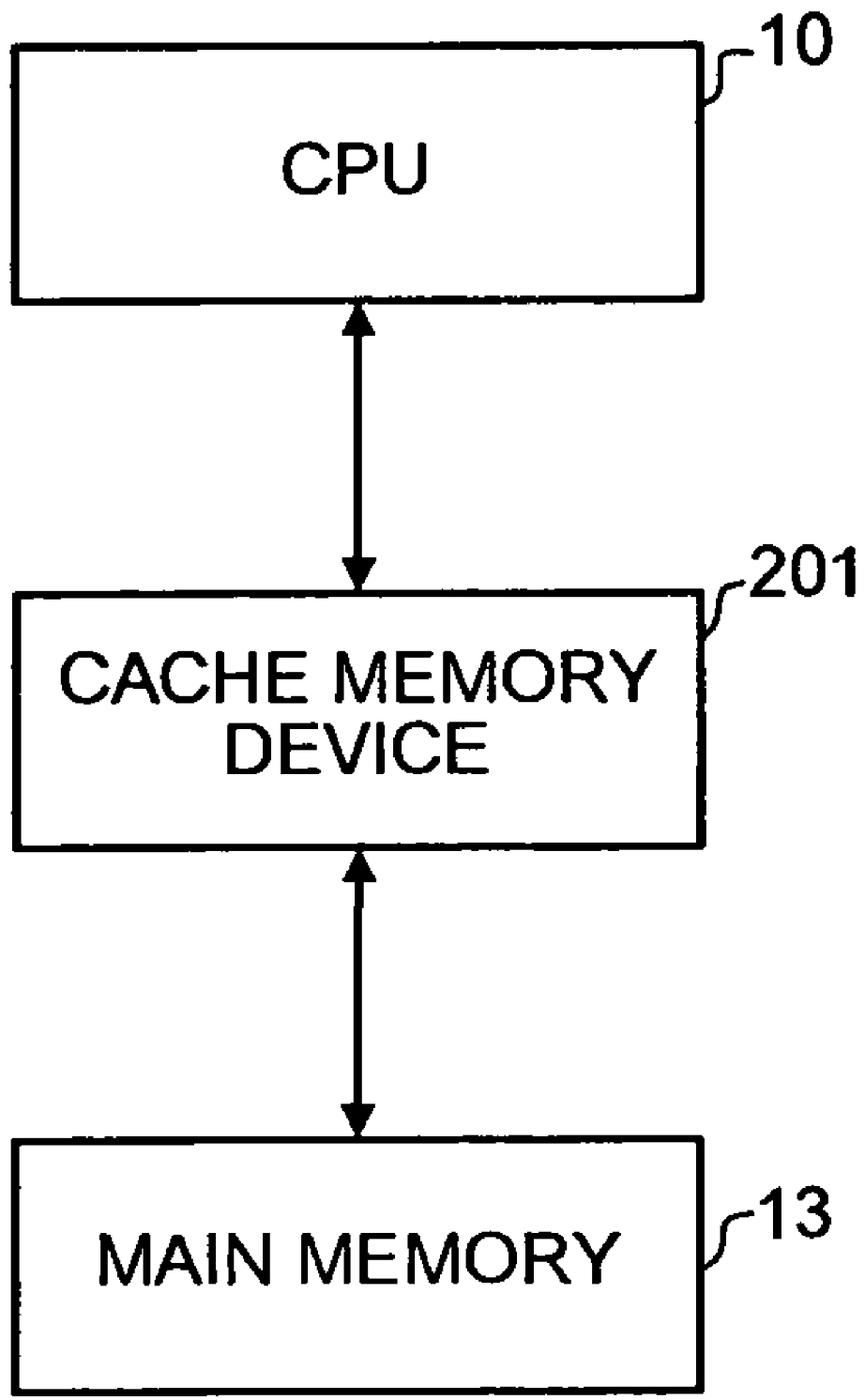
FIG. 7 is a block diagram of an application example of a cache memory device according to a second embodiment of the present invention.

FIG. 7 is a block diagram of an application example of a cache memory device according to the second embodiment of the present invention. In FIG. 7, the same reference numerals are assigned to those corresponding to the portions of FIG. 1, and explanation thereof is omitted. In FIG. 7, a cache memory device 201 is provided instead of the cache memory device 101 of FIG. 1.

The cache memory device 201 is, for example, a CAM device, which has the same functions as those of the cache memory device 101 (see FIG. 1) and further has a function of uniquely identifying a cause of the multiple hits, even if a part of TAG<63:0> (tag) is masked.

Figure 8:
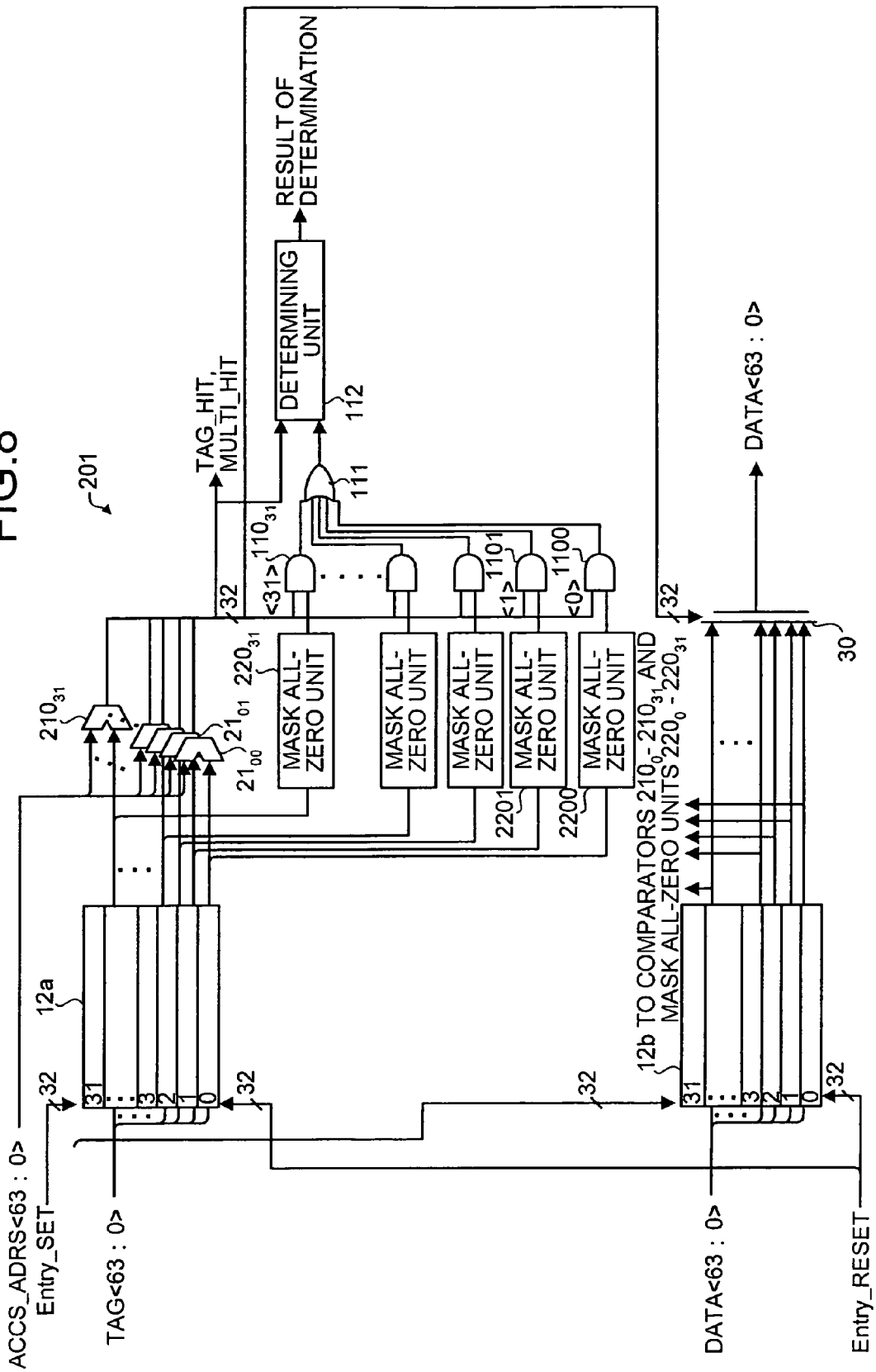
FIG. 8 is a diagram of the cache memory device of FIG. 7.

FIG. 8 is a diagram of the cache memory device 201 of FIG. 7. In FIG. 8, the same reference numerals are assigned to those corresponding to the portions of FIG. 2.

In FIG. 8, comparators $210_0$ to $210_{31}$ are provided instead of the comparators $20_0$ to $20_{31}$ of FIG. 2, and mask all-zero units $220_0$ to $220_{31}$ are newly provided.

The comparators $210_0$ to $210_{31}$ are provided corresponding to the respective Entries 0 to 31 of the tag RAM 12a, and each of them compares a 64-bit search address ACCS_ADRS <63:0> output from the CPU 10 (see FIG. 17) with a tag TAG<63:0> stored in each of the Entries 0 to 31. If the search address and the tag match each other, a relevant one of the comparators $210_0$ to $210_{31}$ outputs the TAG_HIT (tag hit).

However, the comparators $210_0$ to $210_{31}$ have a function of comparing a tag, of the tags TAG<63:0>, in which bits in a previously specified range are masked, with the search address ACCS_ADRS <63:0>.

Figure 9:
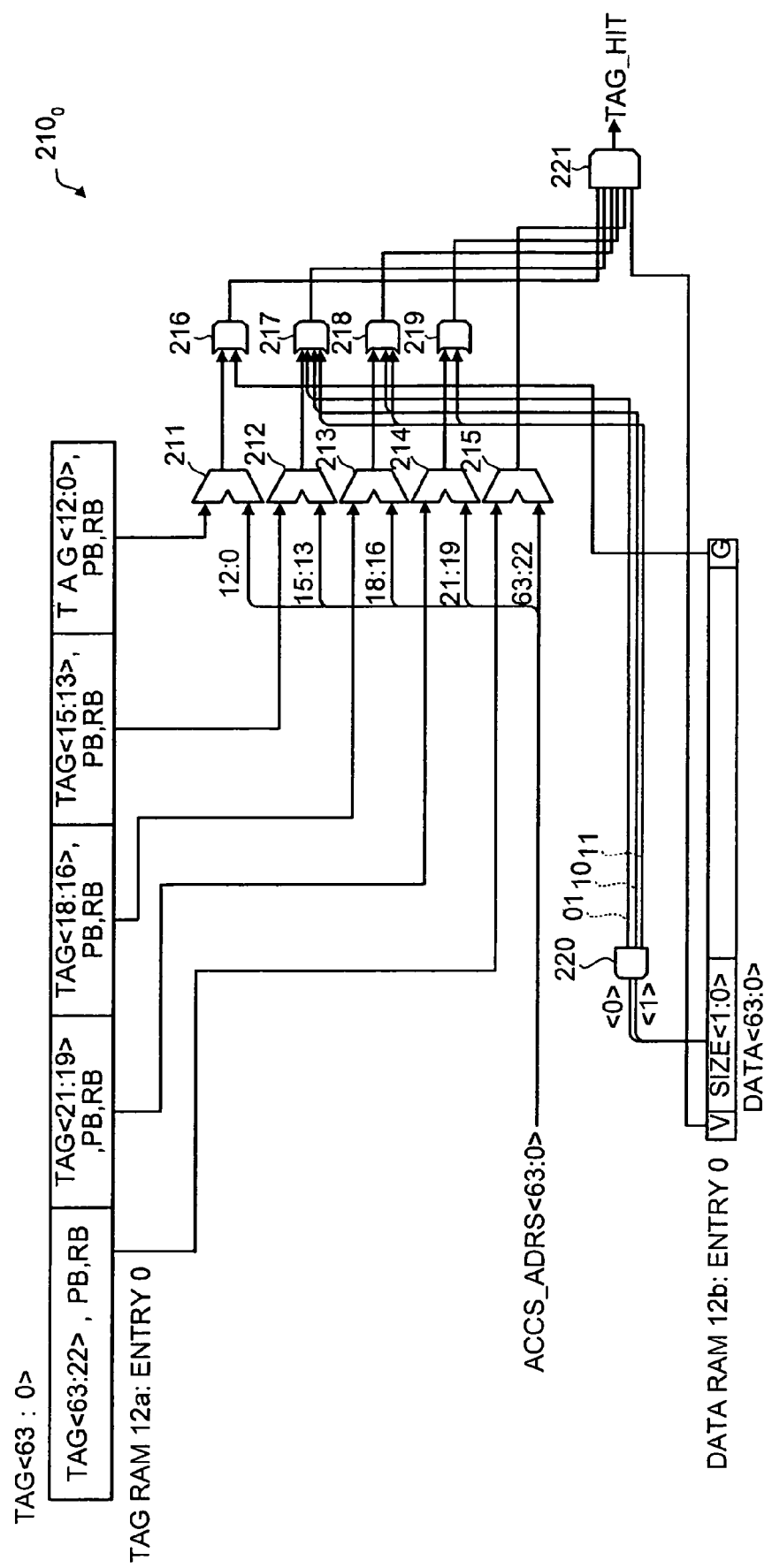
FIG. 9 is a diagram of one of comparators of FIG. 8.

FIG. 9 is a diagram of the comparator $210_0$ of FIG. 8. TAG<63:0> is stored in the Entry 0 of the tag RAM 12a (see FIG. 8).

The TAG<63:0> is divided into units such as TAG<63:22>, TAG<21:19>, TAG<18:16>, TAG<15:13>, and TAG<12:0>, and a parity bit PB and a reverse bit RB are added to each unit similarly to the first embodiment. TAG<63:0> is stored also in the Entries 1 to 31 of the tag RAM 12a, in the same format as that of the Entry 0.

DATA<63:0> is also stored in the Entry 0 of the data RAM 12b. Included in the DATA<63:0> are a valid bit V, a mask control bit SIZE, and a mask control bit G.

The valid bit V indicates validation (1: valid, 0: invalid) of DATA<63:0> (data). As shown in FIG. 10, the mask control bit SIZE and the mask control bit G are used to specify a range of mask bits (bits masked) when bits in TAG<63:0> are to be masked.

As shown in FIG. 10, when the mask control bit G is 1, the bits in TAG<12:0> of TAG<63:0> (see FIG. 9) are masked.

When the mask control bit SIZE is 11, the bits in TAG<21:13> of TAG<63:0> (see FIG. 9) are masked. When the mask control bit SIZE is 10, the bits in TAG<18:13> of TAG<63:0> (see FIG. 9) are masked.

When the mask control bit SIZE is 01, the bits in TAG<15:13> of TAG<63:0> (see FIG. 9) are masked.

Referring back to FIG. 9, comparisons are performed in the following manner. That is, a comparator 211 compares TAG<12:0> with <12:0> of ACCS_ADRS <63:0> (search address), a comparator 212 compares TAG<15:13> with <15:13> of ACCS_ADRS <63:0>, a comparator 213 compares TAG<18:16> with <18:16> of ACCS_ADRS <63:0>, a comparator 214 compares TAG<21:19> with <21:19> of ACCS_ADRS <63:0>, and a comparator 215 compares TAG<63:22> with <63:22> of ACCS_ADRS <63:0>.

An OR circuit 216 performs an OR operation on the output result (TAG<12:0>) of the comparator 211 and the mask control bit G (see FIG. 10). An OR circuit 217 performs an OR operation on the output result (TAG<15:13>) of the comparator 212 and an output of a mask range setting circuit 220.

An OR circuit 218 performs an OR operation on the output result (TAG<18:16>) of the comparator 213 and an output of the mask range setting circuit 220. An OR circuit 219 performs an OR operation on the output result (TAG<21:19>) of the comparator 214 and an output of the mask range setting circuit 220.

An AND circuit 221 performs an AND operation on the outputs of the OR circuits 216 to 219 and the valid bit V. If all of the bits is "1", the AND circuit 221 outputs the TAG_HIT (tag hit).

It is noted that the other comparators $210_1$ to $210_{31}$ of FIG. 8 have the same configuration as that of the comparator $210_0$.

Referring back to FIG. 8, the mask all-zero units $220_0$ to $220_{31}$ are provided corresponding to the respective Entries 0 to 31 of the tag RAM 12a, and have a function of setting all the bits, masked in the comparators $210_0$ to $210_{31}$, to zero, respectively.

Figure 11:
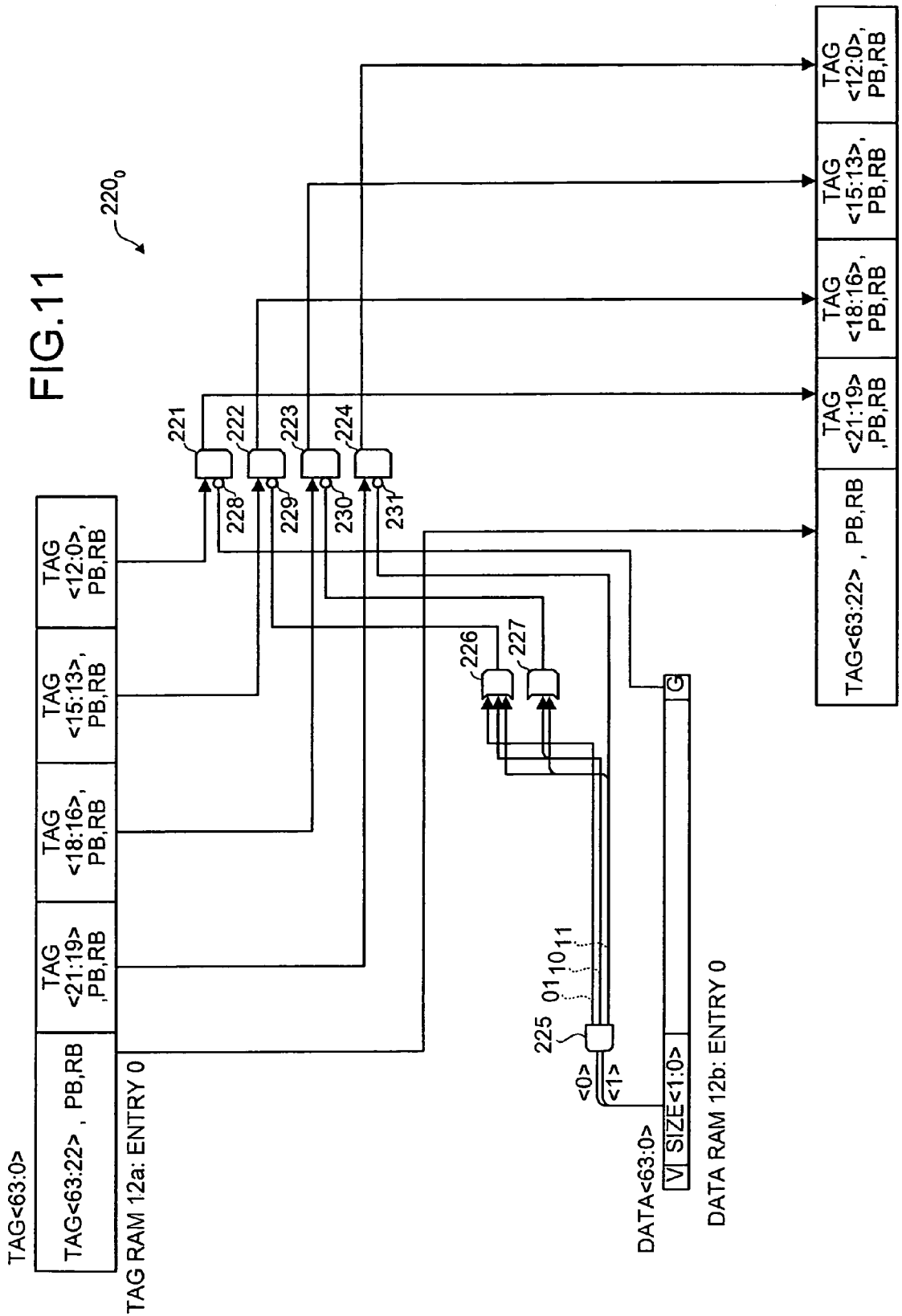
FIG. 11 is a diagram of one of mask all-zero units of FIG. 8.

FIG. 11 is a diagram of the mask all-zero unit $220_0$ of FIG. 8. In FIG. 11, the same reference numerals are assigned to those corresponding to the portions of FIG. 9.

The AND circuit 221 performs an AND operation on TAG<12:0> and a reverse bit obtained by reversing the mask control bit G (see FIG. 10) in a NOT circuit 228.

An AND circuit 222 performs an AND operation on TAG<15:13> and a reverse bit obtained by reversing the output of an OR circuit 226 in a NOT circuit 229.

An AND circuit 223 performs an AND operation on TAG<18:16> and a reverse bit obtained by reversing the output of an OR circuit 227 in a NOT circuit 230.

An AND circuit 224 performs an AND operation on TAG<21:19> and a reverse bit obtained by reversing the output of a mask range setting circuit 225 in a NOT circuit 231. The mask all-zero unit $220_0$ outputs TAG<63:0> in which all the bits masked, of TAG<63:0> input, are set to zero.

Figure 12:
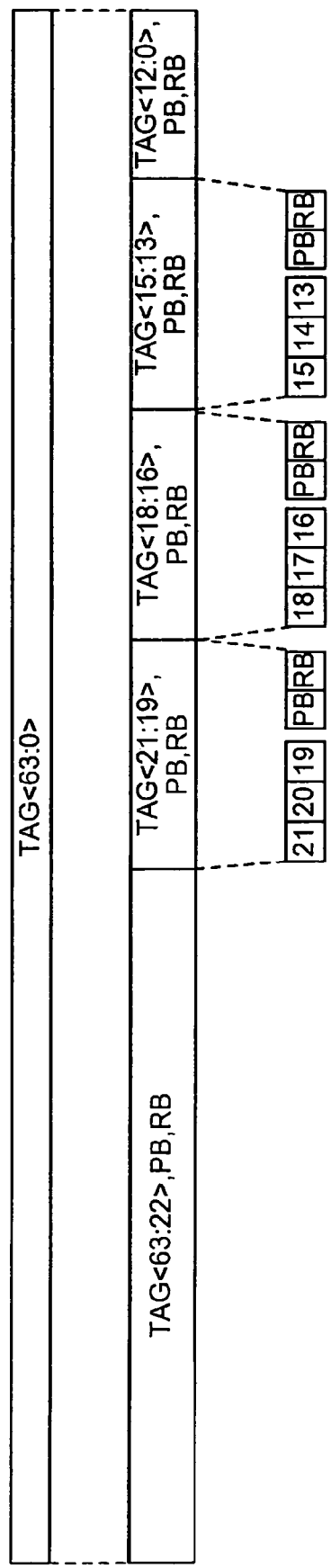
FIG. 12 is a diagram of a structure of TAG<63:0> of FIG. 11.

FIG. 12 is a diagram of the structure of TAG<63:0> as shown in FIG. 9 and FIG. 11. Each entry of the tag RAM 12a stores TAG<63:0>, a parity bit PB, and a reverse bit RB, which are in the format as shown in FIG. 12.

TAG<21:19>, TAG<18:16>, and TAG <15:13> of TAG<63:0>, the parity bit PB, and the reverse bit RB are explained below.

Figure 13:
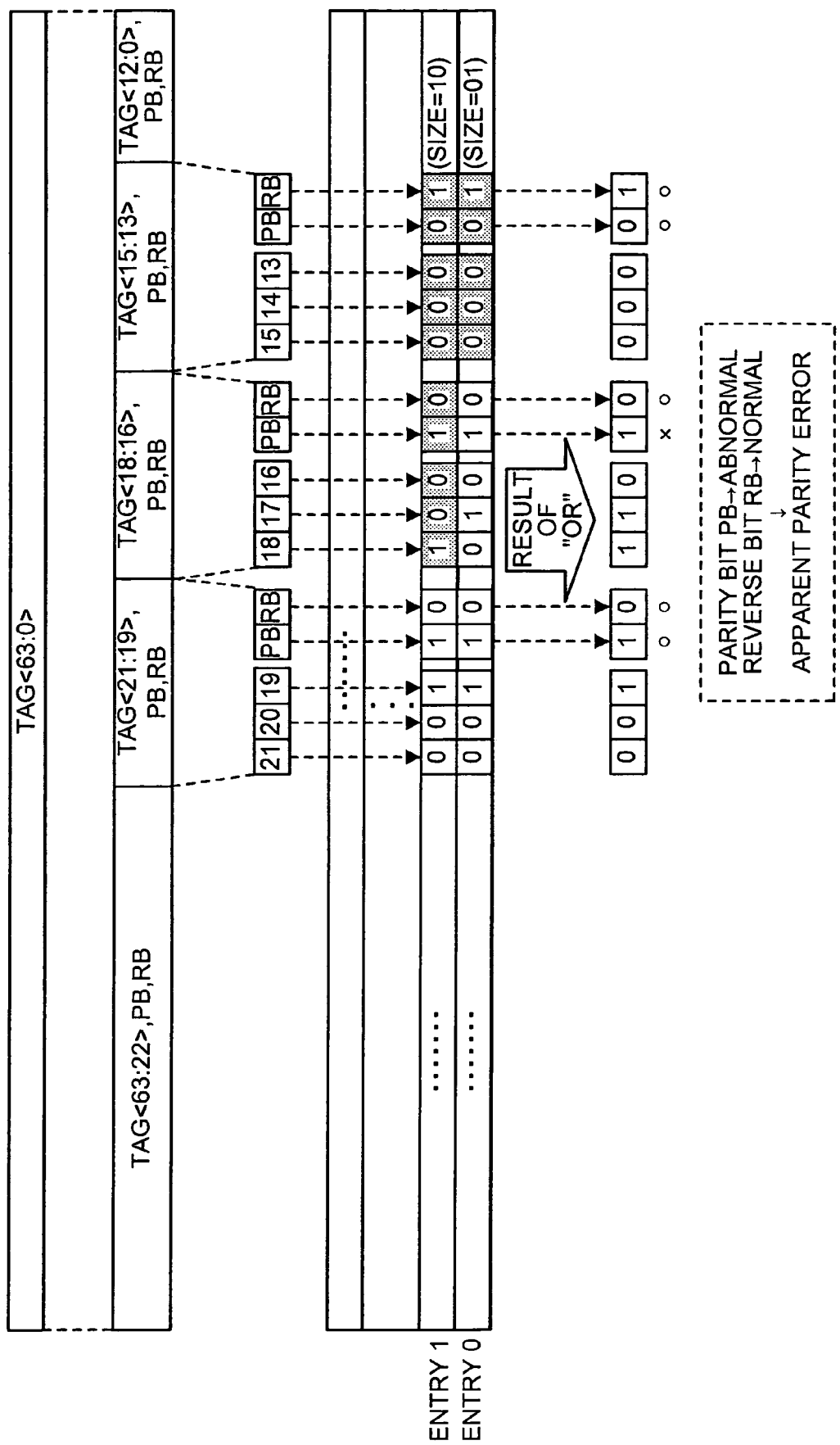
FIG. 13 is a diagram for explaining some problems according to the first embodiment.

As shown in FIG. 13, in the Entry 0 of the tag RAM 12a, "001-10", "010-10", "000-01" are stored in TAG<21:13>, PB, and RB, respectively. Shaded bits (TAG<15:13>, PB, RB) are masked in the comparator $210_1$ based on the mask control bit SIZE=01. The mask bits are excluded from the target for comparison with ACCS_ADRS <63:0> (search address).

Furthermore, in the Entry 1 of the tag RAM 12a, "001-10", "100-10", "000-01" are stored in TAG<21:13>, PB, and RB, respectively. Shaded bits (TAG<18:16>, PB, RB, TAG<15:13>, PB, RB) are masked in the comparator $210_1$ based on the mask control bit SIZE=10.

If the search address ACCS_ADRS <63:0> including ACCS_ADRS <21:13> consisting of "00101011" is input to the comparators $210_0$ to $210_{31}$ as shown in FIG. 8, the tags TAG<63:0> (including the parity bit PB and reverse bit RB) in the Entry 0 and the Entry 1 of FIG. 13 are determined as the TAG_HIT (tag hit), i.e. multiple hits.

In the case of the first embodiment, as shown in FIG. 13, the OR operation is performed on the Entry 0 and the Entry 1. However, since the parity bit PB in TAG<18:16> is abnormal, it is erroneously determined as an apparent parity error. To avoid this, in the second embodiment, all the bits masked, of TAG<63:0>, are set to zero as shown in FIG. 14 and FIG. 15, thereby preventing the erroneous determination.

Figure 14:
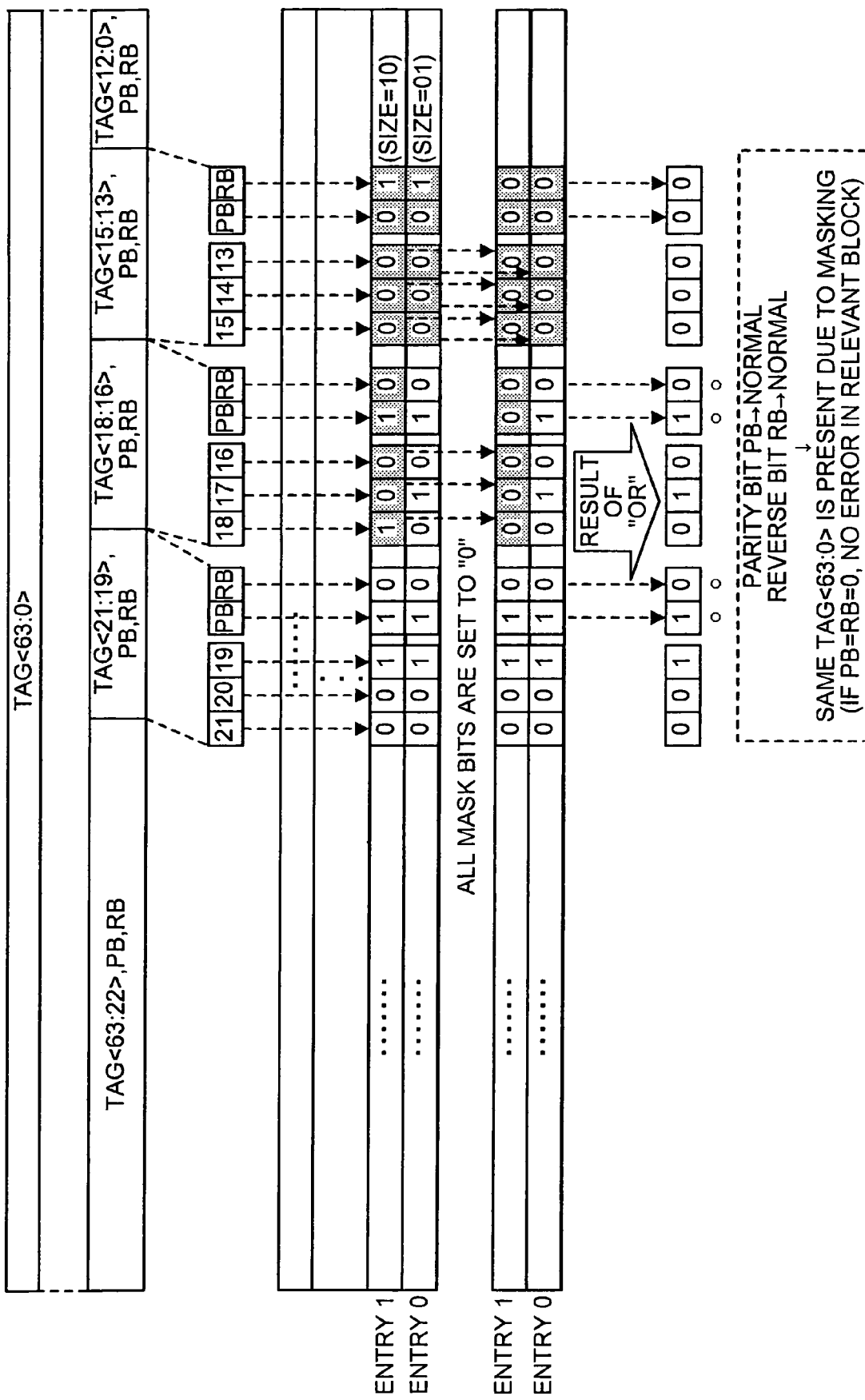
FIG. 14 is a diagram for explaining an operation example 1 according to the second embodiment.
Figure 15:
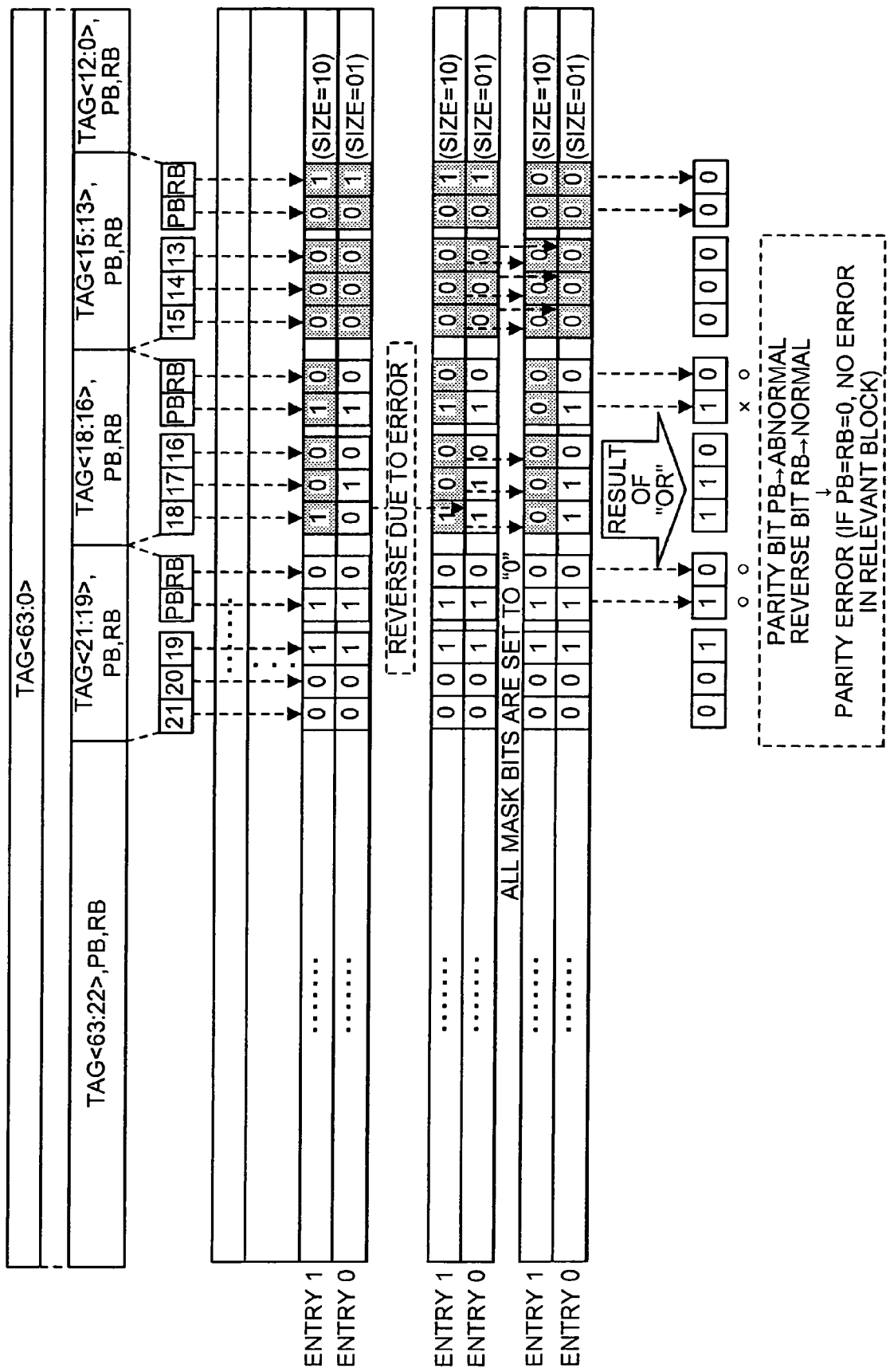
FIG. 15 is a diagram for explaining an operation example 2 according to the second embodiment.

In the case of FIG. 14, all the bits in TAG<15:13> (mask bits, PB, and RB in shaded portions are included) in the Entry 0 are set to zero by the mask all-zero unit $220_0$. All the bits in TAG<18:16> and TAG<15:13> (mask bits, PB, and RB in shaded portions are included) in the Entry 1 are also set to zero by the mask all-zero unit $220_1$.

Then, the OR operation is performed on the Entry 0 and the Entry 1, and the determining unit 112 determines that the parity bit PB is normal and the reverse bit RB is also normal in TAG<21:19> and TAG<18:16>. Therefore, the determining unit 112 determines that redundant presence of the same TAG<63:0> due to masking is the cause of the multiple hits.

The case of PB=RB=0 indicates that mask control is performed, and it is determined that no error occurs in the relevant block (in this case, TAG<15:13>).

On the other hand, as shown in FIG. 15, if the bit is reversed caused by an error, it is determined that the parity error is the cause of the multiple hits. In other words, in FIG. 15, an error occurs in TAG<18> of TAG<18:16> in the Entry 0, so that 0 is reversed to 1.

All the bits in TAG<15:13> of the Entry 0 (mask bits, PB, and RB in shaded portions are included) are set to zero in the mask all-zero unit $220_0$. On the other hand, all the bits in TAG<18:16> and TAG<15:13> of the Entry 1 (mask bits, PB, and RB in the shaded portion are included) are also set to zero in the mask all-zero unit $220_1$.

Then, the OR operation is performed on the Entry 0 and the Entry 1, and the determining unit 112 determines that the parity bit PB is abnormal and the reverse bit RB is normal in TAG<18:16>. Therefore, the determining unit 112 determines that the parity error is the cause of the multiple hits. The case of PB=RB=0 indicates that mask control is performed, and it is determined that no error occurs in the relevant block (in this case, TAG<15:13>).

According to the second embodiment as explained above, even if the bits are masked, the cause of occurrence of multiple hits can be uniquely identified with a small-scale and simple configuration.

In the second embodiment, the mask all-zero units $220_0$ to $220_{31}$ of FIG. 8 may be connected to the tag RAM 12a immediately before TAG<63:0> (tag) is stored in the tag RAM 12a, thereby making the TAG itself to be stored in the tag RAM 12a zero.

In the second embodiment, instead of the mask all-zero units $220_0$ to $220_{31}$ of FIG. 8, 32 mask all-one units (not shown) are provided. And even if all the bits are set to 1 to reverse the bits by a reverse circuit immediately before the AND circuits $110_0$ to $110_{31}$, the same effect can be obtained.

Figure 16:
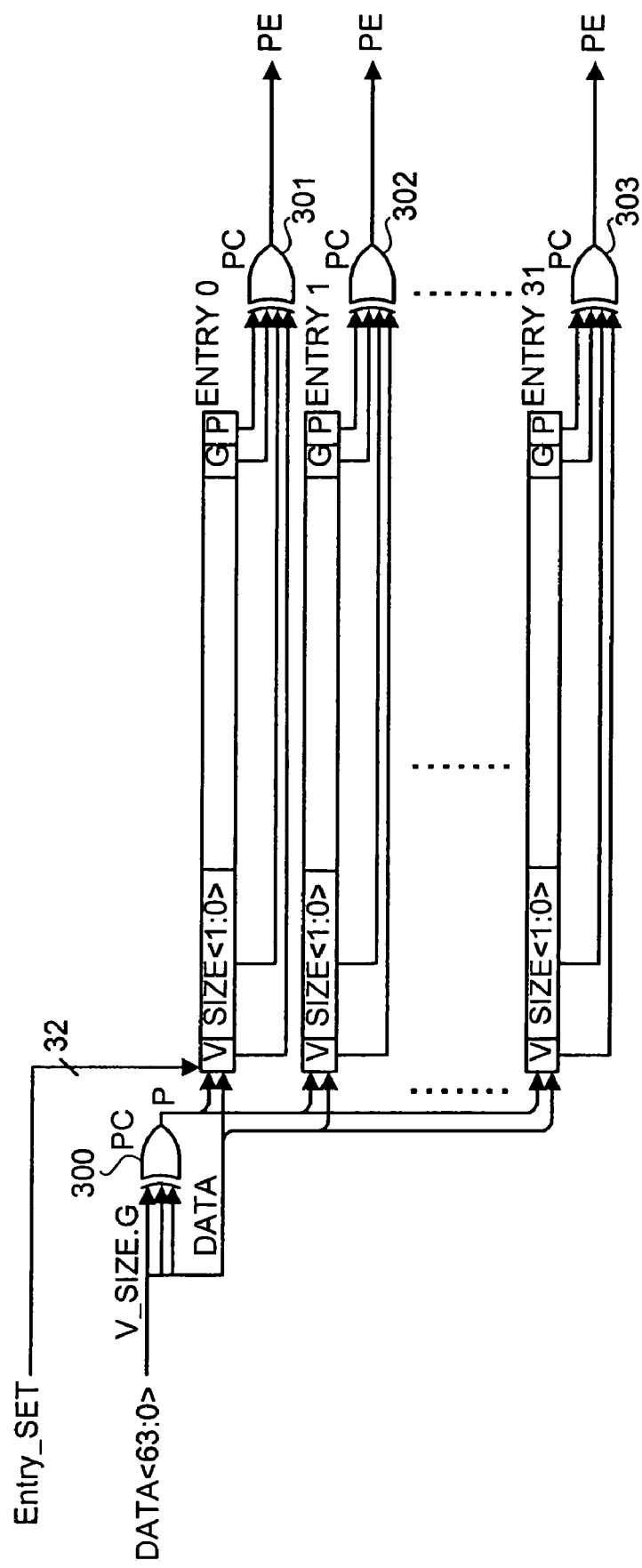
FIG. 16 is a diagram for explaining a modification according to the second embodiment.

In the second embodiment, as shown in FIG. 16, exclusive OR circuits 300 to 303 may perform the parity check on the mask control bit (SIZE<1:0>, G) and the valid bit V in DATA<63:0> stored respectively in the Entries 0 to 31 of the data RAM 12b, to enhance reliability. In FIG. 16, character P indicates a parity bit, and PE indicates a parity error.

The first embodiment and the second embodiment of the present invention are explained in detail with reference to the drawings, but specific examples of the configurations are not limited by these embodiments. It should be understood that various changes in design or so may be made in the present invention without departing from the spirit and scope thereof.

According to one aspect of the present invention, a plurality of tags corresponding to a plurality of addresses, a parity bit of each of the tags, and a reverse bit obtained by reversing the parity bit are stored in a plurality of entries, respectively. A search address is compared with the tag in each of the entries, and when multiple hits, indicating a plurality of matches, occur, an OR operation is performed on contents stored in the relevant entries, and the cause of the multiple hits is determined based on a parity bit and a reverse bit obtained after the OR operation. Therefore, the cause of occurrence of the multiple hits can be uniquely identified with a small-scale and simple configuration.

Furthermore, a portion of the tag is masked, and the portion masked is excluded from a target for comparison by the comparator, and the portion masked is set to all "0" or all "1". Therefore, even if bits are masked, the cause of occurrence of the multiple hits can be uniquely identified with a small-scale and simple configuration.

Moreover, bits are masked based on mask control data that is included in data stored, and whether any error occurs in the mask control data is checked. Therefore, reliability can be enhanced.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A content-addressable-memory device, comprising:
a tag storing unit that stores a plurality of entries, each entry including a tag corresponding to an address, a parity bit of the tag, and a reverse bit obtained by reversing the parity bit;
a data storing unit that stores data corresponding to each entry;
a comparing unit that compares a search address with the tag of each of the entries to find any plurality of matching entries, each with a matching tag that matches the search address, as a multi-hit occurrence; and
a determining unit that performs an OR-operation on the matching entries when the comparing unit finds the matching entries as the multi-hit occurrence, and determines a cause of the multi-hit occurrence based on a result of the OR operation for the parity bit and a result of the OR operation for the reverse bit, by determining the cause of the multi-hit occurrence to be a parity error if the result of the OR operation for the parity bit is equal to the result of the OR operation for the reverse bit and determining the cause of the multi-hit occurrence not to be the parity error if the result of the OR operation for the parity bit is not equal to the result of the OR operation for the reverse bit.

2. The content-addressable-memory device according to claim 1, further comprising:
a masking unit that masks a portion of the tag, and excludes the masked portion from a target for the comparison by the comparing unit; and
a masked-portion changing unit that changes the masked portion to all "0" or all "1".

3. The content-addressable-memory device according to claim 2, wherein
the data stored in the data storing unit includes mask control data, and
the masking unit masks the tag based on the mask control data, and checks an error in the mask control data.

4. The content-addressable-memory device according to claim 1, wherein
the comparing unit comprises a plurality of comparators each corresponding to one of the entries and each configured to receive the search address and the corresponding entry to compare the search address with the tag of each of the entries, and
the determining unit comprises:
a plurality of AND circuits each corresponding to one of the entries and each configured to receive an output from the comparing unit and the corresponding entry; and an OR circuit configured to receive outputs from the AND circuits and performing the OR-operation determining the cause of the multi-hit occurrence.

5. A method of controlling a content-addressable-memory, the method comprising:

first storing including storing a plurality of entries, each entry including a tag corresponding to an address, a parity bit of the tag, and a reverse bit obtained by reversing the parity bit;

second storing including storing data corresponding to each entry;

comparing a search address with the tag of each of the entries to find any plurality of matching entries, each with a matching tag that matches the search address, as a multi-hit occurrence;

performing, when the matching entries are found as the multi-hit occurrence, an OR-operation on the matching entries; and determining a cause of the multi-hit occurrence based on a result of the OR operation for the parity bit and a result of the OR operation for the reverse bit, by determining the cause of the multi-hit occurrence to be a parity error if the result of the OR operation for the parity bit equals the result of the OR operation for the reverse bit and determining the cause of the multi-hit occurrence not to be the parity error if the result of the OR operation for the parity bit does not equal the result of the OR operation for the reverse bit.

6. The method according to claim 5, further comprising:

masking a portion of the tag, and excludes the masked portion from a target for the comparison at the comparing; and changing the masked portion to all "0" or all "1".

7. The method according to claim 6, wherein the data stored at the second storing includes mask control data, and the masking includes masking the tag based on the mask control data; and checking an error in the mask control data.

* * * * *